(12) United States Patent
Lim et al.

(10) Patent No.: US 7,238,412 B2
(45) Date of Patent: Jul. 3, 2007

(54) THERMALLY AND ELECTRICALLY CONDUCTING HIGH INDEX CONTRAST MULTI-LAYER MIRRORS AND DEVICES

(75) Inventors: Desmond R. Lim, Cambridge, MA (US); Kazumi Wada, Lexington, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/997,107

(22) Filed: Nov. 29, 2001

(65) Prior Publication Data

US 2002/0089637 A1 Jul. 11, 2002

Related U.S. Application Data

(60) Provisional application No. 60/253,910, filed on Nov. 29, 2000.

(51) Int. Cl.
*B32B 27/32* (2006.01)
*B32B 9/00* (2006.01)
*B32B 9/04* (2006.01)

(52) U.S. Cl. ............... 428/220; 428/408; 428/446; 428/701; 428/702

(58) Field of Classification Search ........... 428/212, 428/220, 408, 446, 701, 702; 385/112, 16, 385/142
See application file for complete search history.

(56) References Cited

U.S. PATENT DOCUMENTS

| 5,568,499 A | | 10/1996 | Lear | |
|---|---|---|---|---|
| 5,615,289 A | * | 3/1997 | Duck et al. | 385/24 |
| 5,783,049 A | * | 7/1998 | Bright et al. | 204/192.14 |
| 6,077,569 A | * | 6/2000 | Knapp et al. | 427/534 |
| 6,262,830 B1 | * | 7/2001 | Scalora | 359/248 |
| 6,343,167 B1 | * | 1/2002 | Scalora et al. | 385/37 |

FOREIGN PATENT DOCUMENTS

EP 0 978 737 A1 2/2000

OTHER PUBLICATIONS

"Improved Electrical and Thermal Properties of InP-AlGaAsSb Bragg Mirrors for Long-Wavelength Vertical-Cavity Lasers," Almuneau et al. *IEEE Photonics Technology Letters*. Oct. 2000. vol. 12, No. 10.

"Optical Filters for Plasma Display Panels Using Organic Dyes and Sputtered Multilayer Coatings," Okamura et al. *Journal of Vacuum Science Technology*. Jul./Aug. 2001.

* cited by examiner

*Primary Examiner*—Rena Dye
*Assistant Examiner*—Lawrence Ferguson
(74) *Attorney, Agent, or Firm*—Gauthier & Connors LLP

(57) ABSTRACT

An optical device is provided. The optical device includes a plurality of high index layers. The optical device also includes a plurality of low index layers. The optical device is formed by creating alternating layers of the plurality of high layers and the plurality of low index layers, such that electricity and heat is allowed to be conducted through said optical device.

13 Claims, 1 Drawing Sheet

THERMALLY AND ELECTRICALLY CONDUCTING HIGH INDEX CONTRAST MULTI-LAYER MIRRORS AND DEVICES

PRIORITY INFORMATION

This application claims priority from provisional application Ser. No. 60/253,910 filed Nov. 29, 2000.

BACKGROUND OF THE INVENTION

The present invention is in the field of optics, specifically in changing the characteristics of the resonance of multi-layer Fabry-Perot resonators or ID Photonic Band Gap.

Low index contrast multi-layer structures have been fabricated to form VCSELs (Vertical Cavity Surface Emitting Lasers). These low index contrast multi-layers have a disadvantage in that their stop bands are very small, thus requiring more layers to achieve a high reflection. Essentially, these layers may become too bulky to be used with other integrated components. On the other hand, high index contrast multi-layer structures have poor thermal and electrical conductivity properties. As a result, it is difficult to electrically drive a cavity embedded in a high index contrast multi-layer structure. Furthermore, any heat that is generated in the cavity layer is not easily dissipated. Therefore, it would be difficult to electrically drive light emitting diodes, lasers or the like in such structures.

SUMMARY OF THE INVENTION

Accordingly, the invention presents a novel method that will alleviate the problems of poor thermal and electrical conductivity of high index contrast multi-layer systems. Varying the layers of high index degenerately doped semiconductor and the lower index high thermal and electrical conductivity layers will result in a multi-layer structure that would permit both electrical injection and thermal stabilization.

According to one aspect of the invention, an optical device is provided. The optical device includes a plurality of high contrast layers. The optical device also includes a plurality of low index layers. The optical device is formed by creating alternating layers of the plurality of high index layers and the plurality of low index layers, such that electricity and heat is conducted through said optical device.

According to another aspect of the invention, a method for forming an optical device is provided. The method includes providing a plurality of high index layers. The method also includes providing a plurality of low index layers. The optical device is formed by creating alternating layers of the plurality of high layers and the plurality of low index layers, such that electricity and heat is conducted through said optical device.

According to another aspect of the invention, a Fabry-Perot device is provided. The Fabry-Perot device includes a plurality of high index layers, and a plurality of low index layers. The Fabry-Perot also includes a top mirror that includes alternating layers of the plurality of high index layers and the plurality of low index layers, and a cavity structure that includes a bulk of a selective material. The Fabry-Perot also includes a bottom mirror that includes alternating layers of the plurality of high index layers and the plurality of low index layers, wherein the top mirror and bottom mirror allow electricity and heat is conducted through the Fabry-Perot device.

According to another aspect of the present invention, a process for forming an optical device is provided. The process includes the steps of providing a plurality of high index layers, and providing a plurality of low index layers, wherein the optical device is formed by creating alternating layers of the plurality of high index layers and plurality of low index layers, such that electricity and heat is conducted through said optical device.

According to another aspect of the invention, a method of forming a Fabry-Perot device is provided. The method includes the steps of providing a plurality of high index layers, and providing a plurality of low index layers. The method also includes the steps of forming a top mirror that includes alternating layers of the plurality of high index layers and the plurality of low index layers, and a cavity structure that includes a bulk of a selective material. The Fabry-Perot also includes a bottom mirror that includes alternating layers of the plurality of high index layers and the plurality of low index layers, wherein the top mirror and bottom mirror allow electricity and heat to be conducted through the Fabry-Perot device.

DETAILED DESCRIPTION OF THE INVENTION

Figure 1:
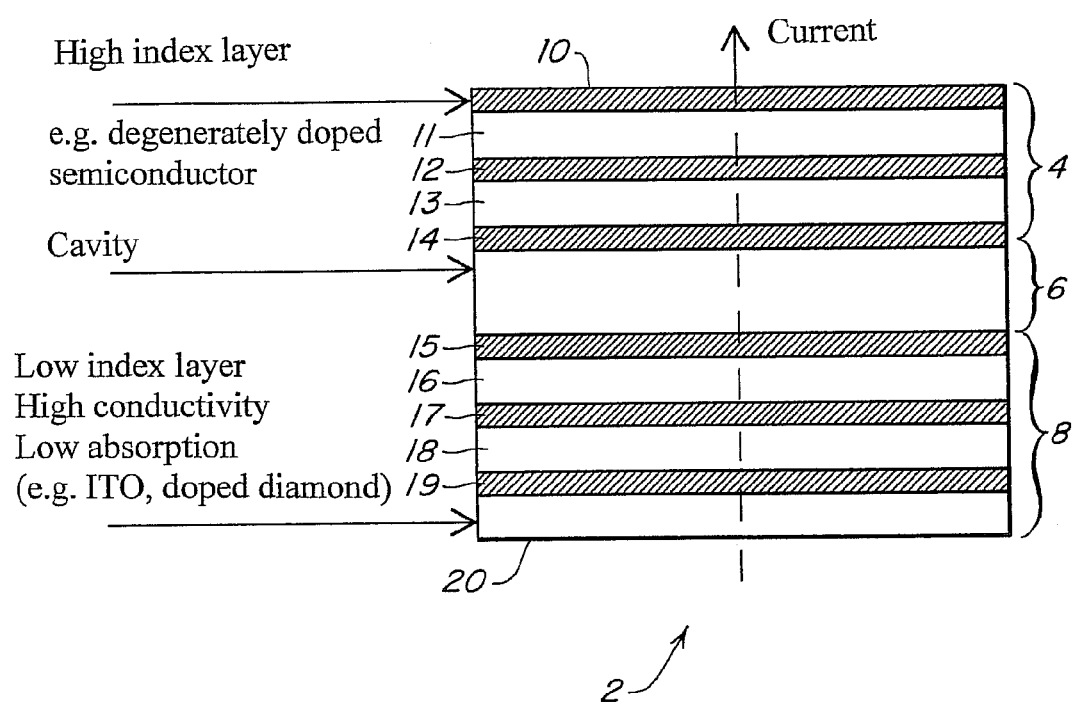
FIG. 1 is a schematic block diagram illustrating the alternating layers of high index degenerately doped materials and the lower index high thermal and electrical conductivity materials.

The invention illustrates a device and method of improving thermal and electrical conductivity of high index contrast multi-layer systems. By alternating the layers in a high index contrast multi-layer system between high index degenerately doped semiconductor materials and the lower index high thermal electrical conductivity materials will result in a system that permits both electrical injection and thermal stabilization.

The major problem with low index materials is that these materials normally exhibit low electrical and thermal conductivity. Thus, it is necessary to find low index materials that possess both a wide band gap and sufficient doping to provide a high or hole population for thermal and electrical conduction.

Doped oxides, such as Indium Tin Oxides (ITO) have been known to possess wide band gaps. ITOs also have been commonly used as top contacts for LED and other electro-optical structures where a conducting but transparent contact is needed. The ITO's wide-band gap property ensures that loss in such structures will be due to scattering off carriers and not to band-to-band transitions. Thus, ensuring that the ITO will not exhibit large absorption losses because of its wide-band gap property. The mixture of tin in ITO acts as a dopant and the degenerate effects of the doping results in the ITO having a large electron density. The invention may utilize other low index materials having high thermal and electrical conductivity with doped wide band-gaps, such as doped diamonds. For purposes of illustration, the invention will be described using ITO as the low index material.

FIG. 1 is a schematic block diagram illustrating the alternating layers of high index degenerately doped materials and the lower index high thermal and electrical conductivity materials. The invention is a device that includes a multi-layer optical micro-resonator device 2 that further includes any number of alternating high index layers 10, 12, 14, 15, 17, and 19 and low index layers 11, 13, 16, 18, and 20, such that the low and high index layers 10–20 can all conduct electricity and/or heat and the index difference between the high and low index regions is greater than 0.3.

The arrangement shown in FIG. 1 is a Fabry-Perot device 2, however the invention may be used in other mirror dielectric arrangements. The layers 10–20 of such a device 2 can be separated into three distinct groups: a top mirror 4, a cavity structure 6 and a bottom mirror 8. The top mirror 4 and bottom mirror 8 both include alternating layers 10–20 of high and low index materials. The cavity structure 6 may be made from materials with high indexes. The thickness of each of the layers 10–20 that form the mirrors 4 and 8 is chosen so that it is a quarter of the wavelength of interest in the material, i.e., the thickness of each layer 10–20 is λ/4n, where λ is the center operating wavelength in free space, and n is the index of each layer 10–20. The thickness of the device structure 6 is usually an integer multiple of λ/2n, to the first order.

The invention heavily depends on the selection of a low index material with good electrical and thermal conductivity, which is also transparent. One such material is the ITO, as discussed above. The selection of such a material coupled with the correct doping of the higher index layer 10, 12, 14, 15, 17, or 19 must follow the following relationship for a mirror structure to possess good transmittance, good electrical conductivity and good thermal conductivity $$E_{g,l} > E_{g,h} > hc/\lambda \quad (1)$$

where $E_{g,h}$ is the band gap of a high index material, $E_{g,l}$ is the band gap of the low index material, λ is wavelength of light of interest, h is Plank constant, and c is the speed of light. Following relation (1) guides one to properly select which low index and high index materials to choose from that does not require trial and error. Relation (1) also guarantees optimal performance of the alternating layers of high and low indexes 10–20.

The index of refraction of ITO is approximately 2, while a high index material such as doped silicon is about 3.4. This large index contrast results in large reflectivity over a wide frequency bandwidth using just a few layers. Also, the high thermal and electrical conductivity of each layer 10–20 results in tunneling junctions between the two differing materials systems.

The high index contrast multi-layered structure 2 may be fabricated by any of the standard techniques that are used to make other multi-layered structures. The preferred choice for fabrication is based on sputtering alternating layers of high and low index materials 10–20. Another technique may be utilizing bonding, smart cut technique or polishing technique, to achieve the desired for alternating high and low index layers 10–20.

One of the major advantages of using high index contrast multi-layer mirrors or cavities is that they require much fewer layers than their low index counter-parts. Also, they are much thinner than their low index contrast multi-layer structures. Thus, these structures are more usable among various integrated components.

The invention may be used in various applications, such as lasers, tunable filters or mirrors. In a laser or tunable applications, the structure would have one or more electrically active layers that are pumped by electrical injection. The structure can dissipate heat through the alternating high and low index materials.

Although the present invention has been shown and described with respect to several preferred embodiments thereof, various changes, omissions and additions to the form and detail thereof, may be made therein, without departing from the spirit and scope of the invention.

What is claimed is:

1. An optical device comprising:
   a plurality of high index layers comprising high index degenerately doped materials;
   a plurality of low index layers comprising high thermal and electrically conductive materials, said low index layers are doped diamonds; and
   a mirror structure having alternating layers of said plurality of high index layers and said plurality of low index layers having a relationship $$E_{g,l} > E_{g,h} > hc/\lambda$$

where $E_{g,h}$ is the band gap of a high index material used in said high index layers, $E_{g,l}$ is the band gap of a low index material used in said low index layers, λ is wavelength of light of interest, h is Plank constant, and c is the speed of light so that electricity and heat is conducted through said optical device, wherein the index difference between said plurality of high index layers and plurality of low index layers is greater than 0.3.

2. The optical device of claim 1, wherein the said plurality of low index layers are Indium Tin Oxides.

3. The optical device of claim 1, wherein said plurality of high index layer are doped silicon.

4. The optical device of claim 1, wherein said plurality of low index layers possess wide band gaps.

5. The optical device of claim 4, wherein said wide band gaps ensure that the loss in said optical device will be due to scattering off carriers.

6. The optical device of claim 4, wherein said low index layers exhibit low absorption losses.

7. The optical device of claim 1, wherein said alternating layers having tunneling junctions between said plurality of high index layer and said low index layers.

8. The optical device of claim 1, wherein said plurality of high index layers result in large reflectivity over a wide frequency bandwidth.

9. The optical device of claim 1, wherein said optical device is defined by sputtering said alternating layers.

10. The optical device of claim 1, wherein said optical device is defined by bonding.

11. The optical device of claim 1, wherein said optical device is defined by utilizing smart cut technique.

12. The optical device of claim 1, wherein said optical device is defined by utilizing polishing technique.

13. A Fabry-Perot device comprising:
    a plurality of high index layers comprising high index degenerately doped materials;
    a plurality of low index layers comprising high thermal and electrically conductive materials;
    a top mirror that includes alternating layers of said plurality of high index layers and said plurality of low index layers;
    a cavity structure that includes a bulk of a selective material; and
    a bottom mirror that includes alternating layers of said plurality of high index layers and said plurality of low index layers;
    said high index layers and said low index layers having a relationship $$E_{g,l} > E_{g,h} > hc/\lambda$$

where $E_{g,h}$ is the band gap of a high index material used in said high index layers, $E_{g,l}$ is the band gap of a low index material used in said low index layers, λ is wavelength of light of interest, h is Plank constant, and c is the speed of light so that said top mirror and bottom mirror allow electricity and heat to be conducted through said Fabry-Perot device, wherein the index difference between said plurality of high index layers and plurality of low index layers is greater than 0.3.

* * * * *